(12) United States Patent
Wang et al.

(10) Patent No.: US 12,417,791 B2
(45) Date of Patent: Sep. 16, 2025

(54) DIRECT MEMORY ACCESS (DMA) CIRCUIT AND OPERATION METHOD THEREOF

(71) Applicant: SigmaStar Technology Ltd., Xiamen (CN)

(72) Inventors: Jian-Zhi Wang, Shanghai (CN); Wei Zhu, Shanghai (CN); Bing-Jie He, Shanghai (CN); Jian Liu, Shanghai (CN); Bo Lin, Shanghai (CN); Ming-Yong Sun, Shanghai (CN)

(73) Assignee: SIGMASTAR TECHNOLOGY LTD., Xiamen (CN)

( * ) Notice: Subject to any disclaimer, the term of this patent is extended or adjusted under 35 U.S.C. 154(b) by 181 days.

(21) Appl. No.: 18/544,499

(22) Filed: Dec. 19, 2023

(65) Prior Publication Data
US 2024/0331746 A1 Oct. 3, 2024

(30) Foreign Application Priority Data

Mar. 28, 2023 (CN) .......................... 202310315561.X

(51) Int. Cl.
*G11C 7/10* (2006.01)
(52) U.S. Cl.
CPC .......... *G11C 7/1069* (2013.01); *G11C 7/1063* (2013.01); *G11C 7/1096* (2013.01)

(58) Field of Classification Search
CPC .... G11C 7/1069; G11C 7/1063; G11C 7/1096
See application file for complete search history.

(56) References Cited

U.S. PATENT DOCUMENTS

| 2002/0099880 A1* | 7/2002 | Martin | G06F 13/28 710/22 |
| 2019/0196989 A1* | 6/2019 | Lu | G11C 7/1051 |

\* cited by examiner

*Primary Examiner* — Han Yang
(74) *Attorney, Agent, or Firm* — WPAT, PC

(57) ABSTRACT

An operation method of a direct memory access (DMA) circuit comprising a buffer circuit and two channels includes following steps: determining first and second start addresses from the buffer circuit respectively according to first and second read requests of first and second channels that respectively correspond to first and second data; determining a read address according to the first start address and a read count; reading a first part of the first data from the buffer circuit according to the read address and updating the read count; reading at least one part of the second data from the buffer circuit according to the second start address after reading the first part of the first data; updating the read address according to the first start address and the updated read count; and reading a second part of the first data from the buffer circuit according to the updated read address.

20 Claims, 20 Drawing Sheets

DIRECT MEMORY ACCESS (DMA) CIRCUIT AND OPERATION METHOD THEREOF

This application claims the benefit of China application Serial No. 202310315561.X, filed on Mar. 28, 2023, the subject matter of which is incorporated herein by reference.

BACKGROUND OF THE INVENTION

1. Field of the Invention

The present invention generally relates to direct memory access (DMA), and, more particularly, to DMA circuits and operation methods thereof.

2. Description of Related Art

For a direct memory access (DMA) circuit, the latency of its data source (e.g., memory) or data destination (e.g., processing circuit) is usually not a fixed value, and the read/write speed of the data source does not always match the read/write speed of the data destination. In addition, when the number of data sources or the number of data destinations is greater than one, data transmission between multiple channels may become congested due to the above latency, reducing the performance of the DMA circuit.

SUMMARY OF THE INVENTION

In view of the issues of the prior art, an object of the present invention is to provide a direct memory access (DMA) circuit and an operation method of the DMA circuit, so as to make an improvement to the prior art.

According to one aspect of the present invention, a method of operating a DMA circuit is provided. The DMA circuit that includes a buffer circuit, a first channel, and a second channel. The method includes the following steps: determining a first start address from the buffer circuit according to a first read request of the first channel, the first read request corresponding to a first data; determining a second start address from the buffer circuit according to a second read request of the second channel, the second read request corresponding to a second data; determining a read address according to the first start address and a first read count; reading a first part of the first data from the buffer circuit according to the read address, and updating the first read count; reading at least one part of the second data from the buffer circuit according to the second start address after reading the first part of the first data; updating the read address according to the first start address and the updated first read count; and reading a second part of the first data from the buffer circuit according to the updated read address.

According to another aspect of the present invention, a DMA circuit is provided. The DMA circuit includes a buffer circuit, a first channel, a second channel, a write status determination circuit, a read address generation circuit, and a control circuit. The first channel is configured to generate a first read request. The second channel is configured to generate a second read request. The write status determination circuit is configured to determine a first start address from the buffer circuit according to the first read request and determine a second start address from the buffer circuit according to the second read request. The first read request corresponds to a first data, and the second read request corresponds to a second data. The read address generation circuit is configured to determine a read address according to the first start address and a first read count. The control circuit is configured to read a first part of the first data from the buffer circuit according to the read address, control the read address generation circuit to update the first read count, and read at least one part of the second data from the buffer circuit according to the second start address after reading the first part of the first data. The read address generation circuit further updates the read address according to the first start address and the updated first read count, and the control circuit further reads a second part of the first data from the buffer circuit according to the updated read address.

The technical means embodied in the embodiments of the present invention can solve at least one of the problems of the prior art. Therefore, compared to the prior art, the present invention can improve the performance of the DMA circuit.

These and other objectives of the present invention no doubt become obvious to those of ordinary skill in the art after reading the following detailed description of the preferred embodiments with reference to the various figures and drawings.

DETAILED DESCRIPTION OF THE EMBODIMENTS

The following description is written by referring to terms of this technical field. If any term is defined in this specification, such term should be interpreted accordingly. In addition, the connection between objects or events in the below-described embodiments can be direct or indirect provided that these embodiments are practicable under such connection. Said "indirect" means that an intermediate object or a physical space exists between the objects, or an intermediate event or a time interval exists between the events.

The disclosure herein includes a direct memory access (DMA) circuit and an operation method thereof. On account of that some or all elements of the DMA circuit could be known, the detail of such elements is omitted provided that such detail has little to do with the features of this disclosure, and that this omission nowhere dissatisfies the specification and enablement requirements. Some or all of the processes of the operation method may be implemented by software and/or firmware and can be performed by the DMA circuit or its equivalent. A person having ordinary skill in the art can choose components or steps equivalent to those described in this specification to carry out the present invention, which means that the scope of this invention is not limited to the embodiments in the specification.

Figure 1:
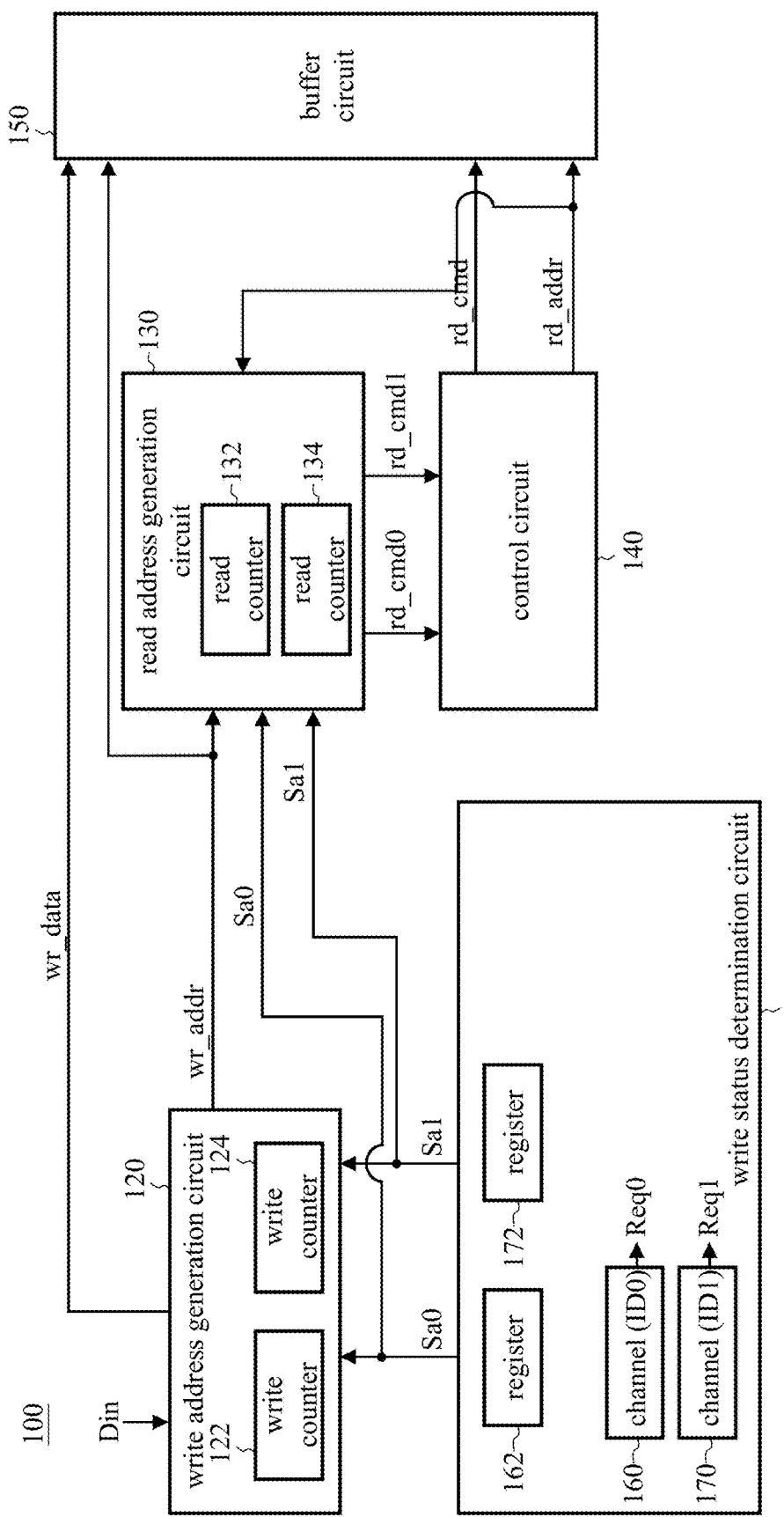
FIG. 1 is a functional block diagram of a direct memory access (DMA) circuit according to an embodiment of the present invention.

FIG. 1 is a functional block diagram of a direct memory access (DMA) circuit 100 according to an embodiment of the present invention. The DMA circuit 100 includes a write status determination circuit 110, a write address generation circuit 120, a read address generation circuit 130, a control circuit 140, and a buffer circuit 150. The write status determination circuit 110 includes a plurality of channels (including but not limited to a channel 160 and a channel 170) and a plurality of registers corresponding to the channels (including but not limited to a register 162 and a register 172 respectively corresponding to the channel 160 and the channel 170). The write address generation circuit 120 includes a plurality of write counters (including but not limited to a write counter 122 and a write counter 124). The read address generation circuit 130 includes a plurality of read counters (including but not limited to a read counter 132 and a read counter 134).

Figure 2:
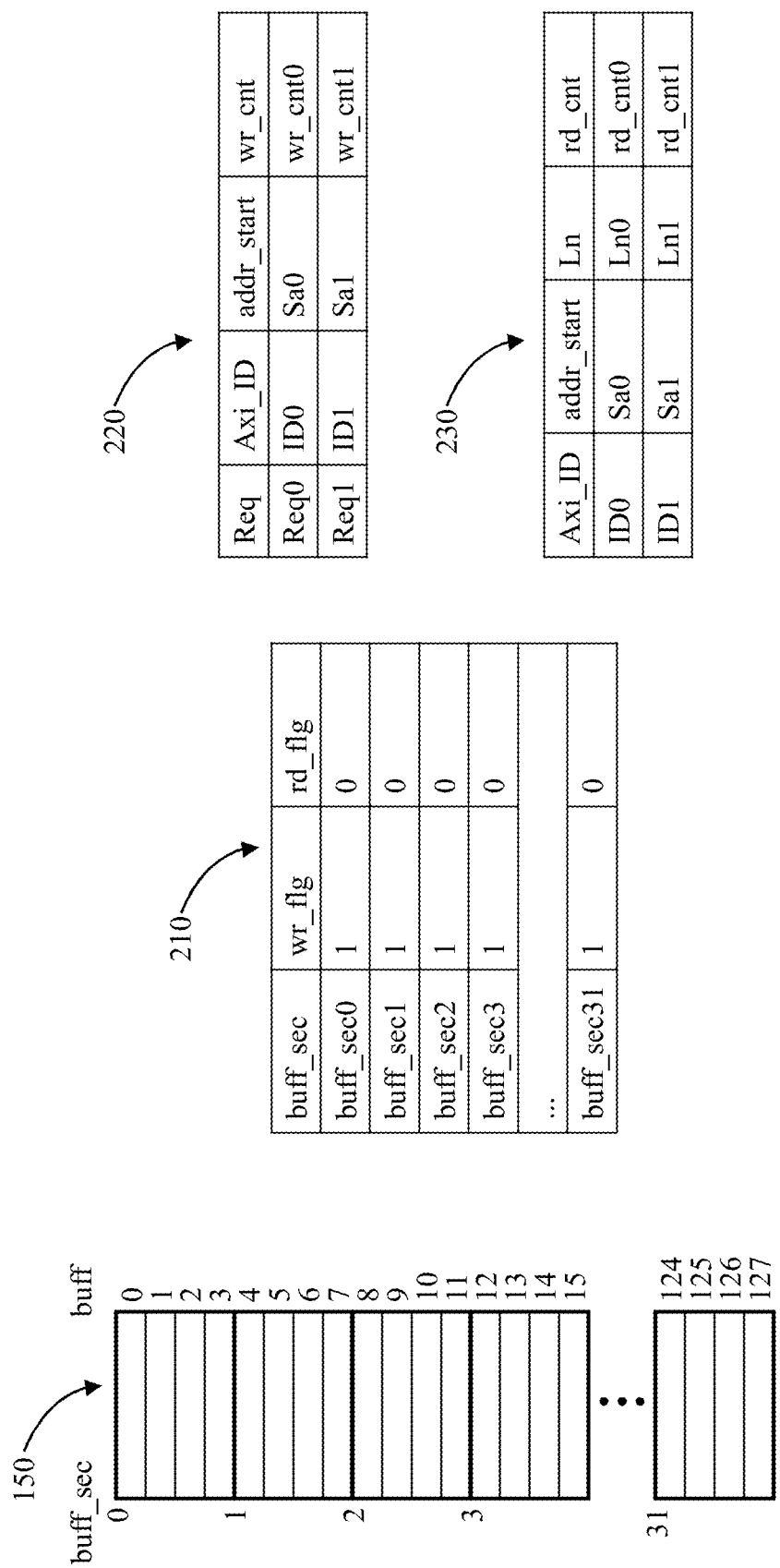
FIGS. 2, 4, 6-8, 10-17, and 20 show the contents of a buffer circuit and some control values of a DMA circuit.

FIG. 2 shows details of the buffer circuit 150 and some control values of the DMA circuit 100. The buffer circuit 150 includes N buffer sections buff_sec (in the example of FIG. 2, N=32 (buff_sec0 to buff_sec31)), and one buffer section buff_sec includes X buffer blocks (in the example of FIG. 2, X=4) (in other words, X is the granularity of a buffer section buff_sec). Therefore, the buffer circuit 150 has a total of N*X buffer blocks (buff0 to buff127).

When X is equal to 1, a buffer section buff_sec is identical to a buffer block buff.

The buffer section status table 210 records the write status flag wr_flg and the read status flag rd_flg of each buffer section buff_sec. The write status table 220 records the Axi identification Axi_ID, the start address addr_start, and the write count wr_cnt corresponding to each read request Req. The Axi identification Axi_ID can also be used as the channel number. The read status table 230 records the start address addr_start, the data length Ln, and the read count rd_cnt of each channel. The start address Sa0 and the start address Sa1 in the write status table 220 are determined by the write status determination circuit 110 and may be stored in the write status determination circuit 110 (e.g., stored in the register 162 and the register 172 respectively). The write count wr_cnt0 and the write count wr_cnt1 in the write status table 220 are the counts of the write counter 122 and the write counter 124 respectively. The read count rd_cnt0 and the read count rd_cnt1 in the read status table 230 are the counts of the read counter 132 and the read counter 134 respectively. The data length Ln0 and the data length Ln1 may be stored in the register 162 and the register 172 respectively.

Figure 3:
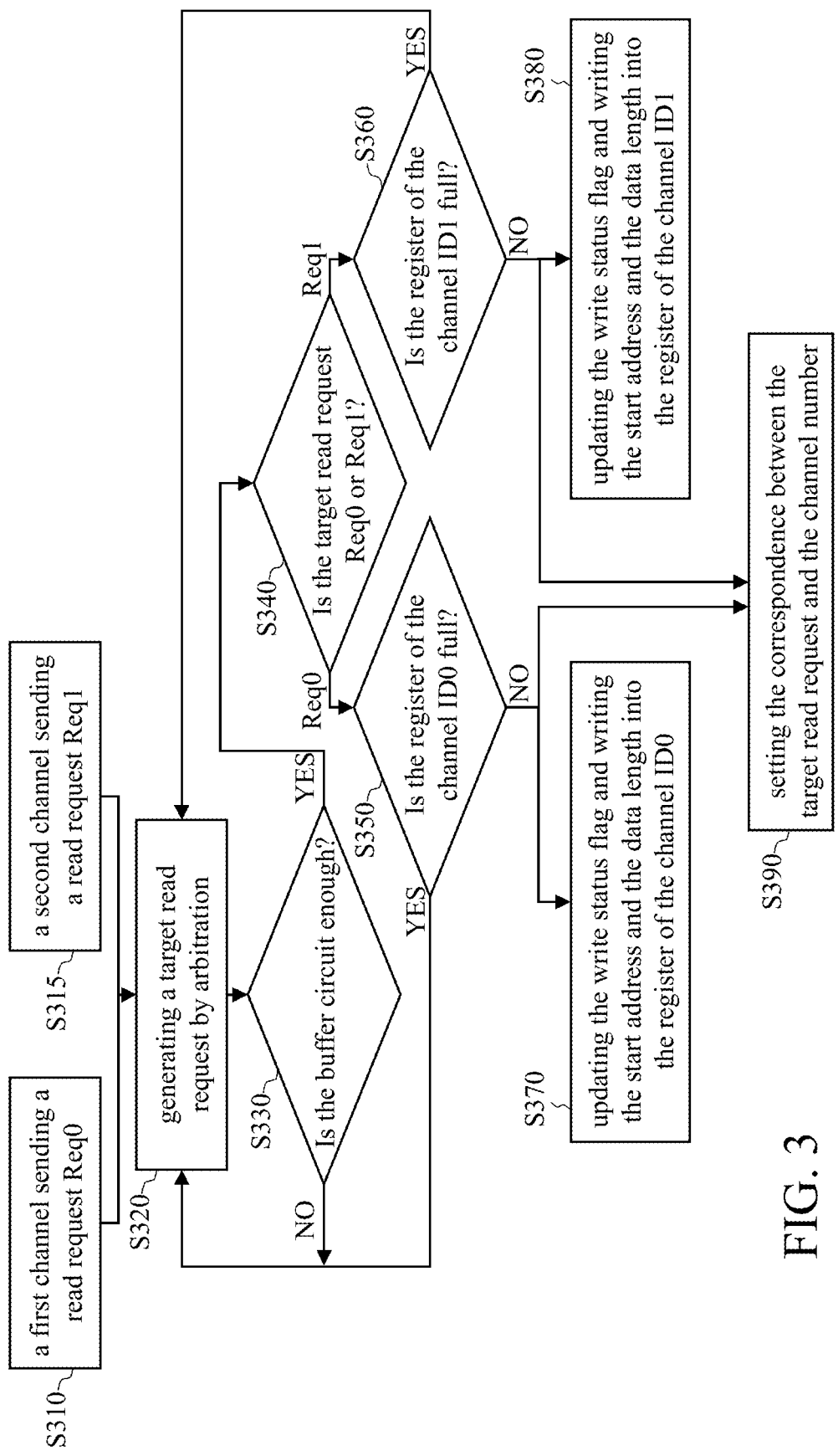
FIG. 3 is a flowchart of configuring the buffer circuit in response to a read request according to an embodiment.

FIG. 3 is a flowchart of configuring the buffer circuit 150 in response to a read request Req according to an embodiment. The flowchart includes the following steps.

Step S310: The channel 160 sends a read request Req0 (corresponding to the first data with data length Ln0).

Step S315: The channel 170 sends a read request Req1 (corresponding to the second data with data length Ln1).

For example, the read request Req0 and the read request Req1 may be read requests to read data from a target device (e.g., an external memory (e.g., a double data rate (DDR) memory) of an electronic device (e.g., a chip) where the DMA circuit 100 is disposed). In some embodiments, the read request Req0 and the read request Req1 correspond to different target devices.

Step S320: The write status determination circuit 110 arbitrates to generate a target read request. The write status determination circuit 110 may include an arbitrator (not shown) for arbitrating between the read request Req0 and the read request Req1 according to a predetermined arbitration rule (e.g., round-robin) to generate the target read request.

Step S330: The write status determination circuit 110 determines whether the buffer circuit 150 has enough unused space (e.g., buffer blocks). More specifically, the write status determination circuit 110 searches the buffer circuit 150 for [Ln/X] unused buffer sections according to the write status flags wr_flg of the buffer sections, the amount of data to be processed (i.e., the data length Ln0 of the first data or the data length Ln1 of the second data), and the granularity X. In some embodiments, the granularity X may be a power of two (i.e., X=1, 2, 4, 8, . . . ). Take FIG. 2 as an example (where X=4) and assume that Ln=6 (i.e., 6/4=2 buffer sections buff_sec are needed). Because there are at least five buffer sections buff_sec whose write status flags wr_flg are the first value (e.g., one, indicating not in use) (i.e., the buffer section buff_sec0, the buffer section buff_sec1, the buffer section buff_sec2, the buffer section buff_sec3, and the buffer section buff_sec31), the result of step S330 is YES.

When the result of step S330 is YES, the write status determination circuit 110 further selects one of the unused Axi identifications Axi_ID of the DMA circuit 100. In the following discussion, it is assumed that the write status determination circuit 110 assigns the Axi identification ID0 to the channel 160 (i.e., the number of the channel 160 is ID0) and assigns the Axi identification ID1 to the channel 170 (i.e., the number of the channel 170 is ID1).

In some embodiments, multiple buffer sections buff_sec or multiple buffer blocks allocated to a read request Req must be contiguous.

Step S340: The write status determination circuit 110 determines whether the target read request is the read request Req0 or the read request Req1. If it is determined that the target read request is the read request Req0, the flow proceeds to step S350. If it is determined that the target read request is the read request Req1, the flow proceeds to step S360.

Step S350: The write status determination circuit 110 determines whether the register 162 of the channel 160 is full. If YES, the write status determination circuit 110 returns to step S320 to arbitrate to generate another target read request; if NO, the write status determination circuit 110 performs step S370 and step S390.

Step S360: The write status determination circuit 110 determines whether the register 172 of the channel 170 is full. If YES, the write status determination circuit 110 returns to step S320 to arbitrate to generate another target read request; if NO, the write status determination circuit 110 performs step S380 and step S390.

Step S370: The write status determination circuit 110 updates the write status flag wr_flg and writes the start address addr_start of the determined buffer section buff_sec and the data length Ln0 of the read request Req0 into the register 162 of the channel 160. Reference is made to FIG. 2, where it is assumed that Ln=Ln0=6 and that the write status determination circuit 110 assigns the buffer section buff_sec0 and the buffer section buff_sec1 to the channel 160, the write status determination circuit 110 updates the write status flags wr_flg of the buffer section buff_sec0 and the buffer section buff_sec1 to the second value (e.g., 0, indicating in use), and writes the data length Ln0 and the start address addr_start of the buffer section buff_sec0 (hereinafter referred to as the start address Sa0) into the register 162.

Step S380: The write status determination circuit 110 updates the write status flag wr_flg, and writes the start address addr_start of the determined buffer section buff_sec and the data length Ln1 of the read request Req1 into the register 172 of the channel 170. Reference is made to FIG.

2, where it is assumed that Ln=Ln1=5 and that the write status determination circuit 110 assigns the buffer section buff_sec2 and the buffer section buff_sec3 to the channel 170, the write status determination circuit 110 updates the write status flags wr_flg of the buffer section buff_sec2 and the buffer section buff_sec3 to the second value, and writes the data length Ln1 and the start address addr_start of the buffer section buff_sec2 (hereinafter referred to as the start address Sa1) into the register 172.

Step S390: The write status determination circuit 110 sets the correspondence between the target read request and the channel number (ID0 or ID1) of the channel (channel 160 or channel 170) (as shown in the write status table 220), facilitating the confirmation of the correspondence between data and channels. More specifically, if step S350 is NO, the write status determination circuit 110 sets the read request Req0 and the Axi identification ID0 to be associated with each other. If step S360 is NO, the write status determination circuit 110 sets the read request Req1 and the Axi identification ID1 to be associated with each other.

Figure 4:
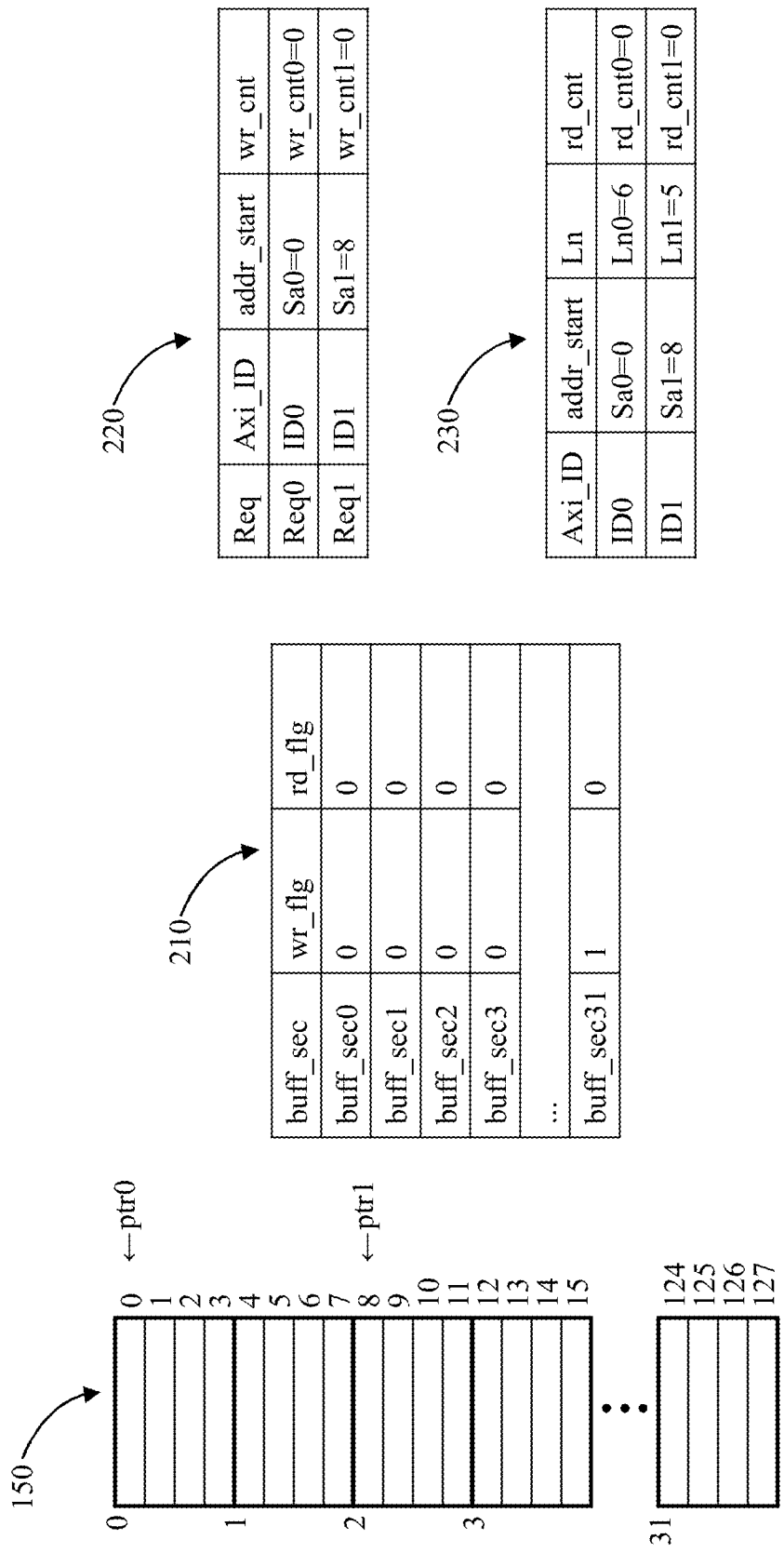

Continuing the above example, after the processes of FIG. 3 are finished, the contents of the buffer circuit 150, the buffer section status table 210, the write status table 220, and the read status table 230 are as shown in FIG. 4. Since no data has been written into and read out of the buffer circuit 150 yet, the write count wr_cnt0, the write count wr_cnt1, the read count rd_cnt0, the read count rd_cnt1, and the read status flag rd_flg are all zero. The read status flag rd_flg is used to record the number of unread data in the corresponding buffer section buff_sec. Taking FIG. 4 as an example, if all four buffer blocks of a buffer section buff_sec have data but only three of them have not been read yet, then the read status flag rd_flg corresponding to the buffer section buff_sec is three. In some embodiments, the number of bits of the read status flag rd_flg may be $\log_2 X+1$. The pointer ptr0 corresponds to the read request Req0 and the channel 160 (ID0). The pointer ptr1 corresponds to the read request Req1 and the channel 170 (ID1). The pointer ptr0 and the pointer ptr1 are used to indicate the addresses of the read operation or write operation, which will be discussed in detail below.

In some embodiments, the number of the buffer section buff_sec can be used as the start address (e.g., Sa0=0, Sa1=2). In subsequent operations, the DMA circuit 100 left shifts the start address Sa0 and the start address Sa1 by $\log_2 X$ bits to obtain the number of the corresponding buffer block (e.g., Sa0=0 corresponds to the buffer block buff0, Sa1=2 corresponds to the buffer block buff8). Compared to storing the buffer block number, storing the number of the buffer section buff_sec can save memory.

Figure 5:
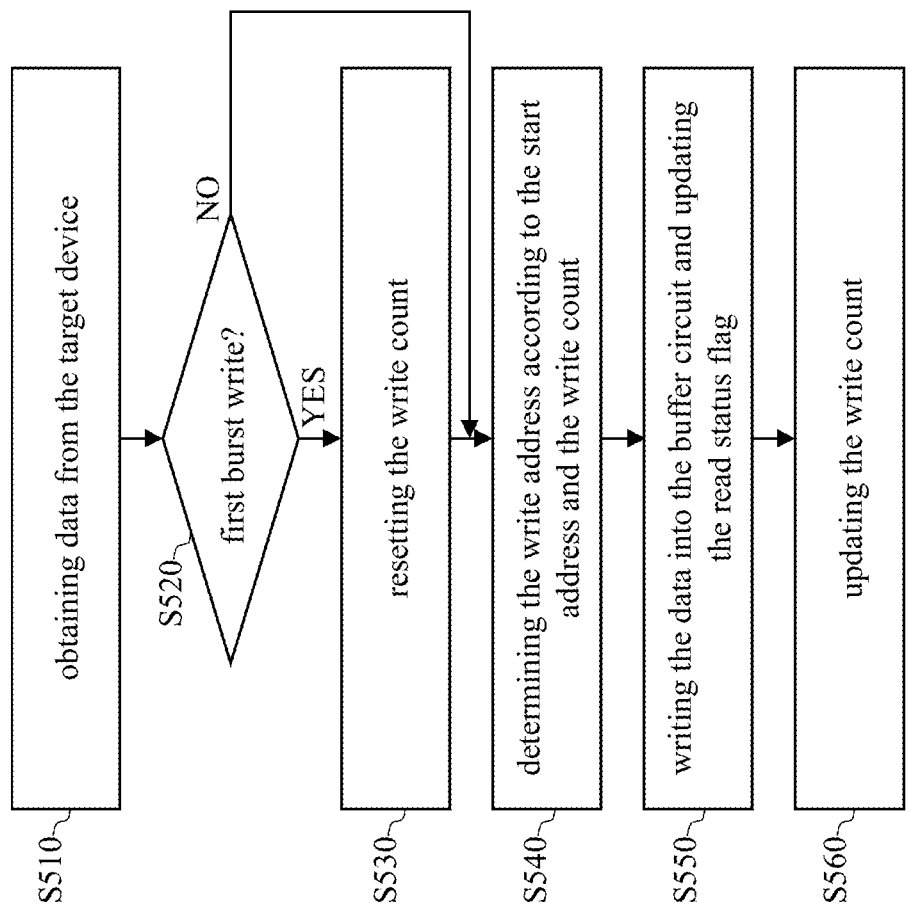
FIG. 5 is a flowchart of a write address generation circuit writing data into the buffer circuit.

Reference is made to FIG. 5 which is a flowchart of the write address generation circuit 120 writing the data Din into the buffer circuit 150. The flowchart includes the following steps.

Step S510: The write address generation circuit 120 obtains the data Din from the target device, that is, reads the corresponding first data or second data from the target device according to the read request Req0 or the read request Req1.

Step S520: The write address generation circuit 120 determines whether this write operation is the first burst write, that is, determines whether the data corresponding to a certain read request Req is written into the buffer circuit 150 for the first time. If YES, the flow proceeds to step S530; if NO, the flow proceeds to step S540.

Step S530: The write address generation circuit 120 resets the write count wr_cnt (e.g., sets the write count wr_cnt to zero). More specifically, the write address generation circuit 120 obtains the corresponding write count wr_cnt from the write status table 220 according to whether the data Din belongs to the read request Req0 or the read request Req1, and resets the corresponding write count wr_cnt.

Step S540: Determining the write address wr_addr according to the start address addr_start and the write count wr_cnt. More specifically, the write address wr_addr is equal to the start address addr_start plus the write count wr_cnt.

Step S550: The write address generation circuit 120 writes the to-be-written data wr_data (i.e., the data Din or a part of the data Din) into the write address wr_addr of the buffer circuit 150 and controls the read address generation circuit 130 to update the corresponding read status flag rd_flg. More specifically, the read address generation circuit 130 updates the read status flag rd_flg corresponding to the write address wr_addr according to the write address wr_addr. For example, if the write address wr_addr corresponds to the buffer section buff_sec1 (i.e., the write address wr_addr is one of the buffer blocks buff4 to buff7), the read address generation circuit 130 updates the read status flag rd_flg of the buffer section buff_sec1 to one.

Step S560: The write address generation circuit 120 updates the write count wr_cnt, that is, adds one to the write count wr_cnt0 or the write count wr_cnt1.

Figure 6:
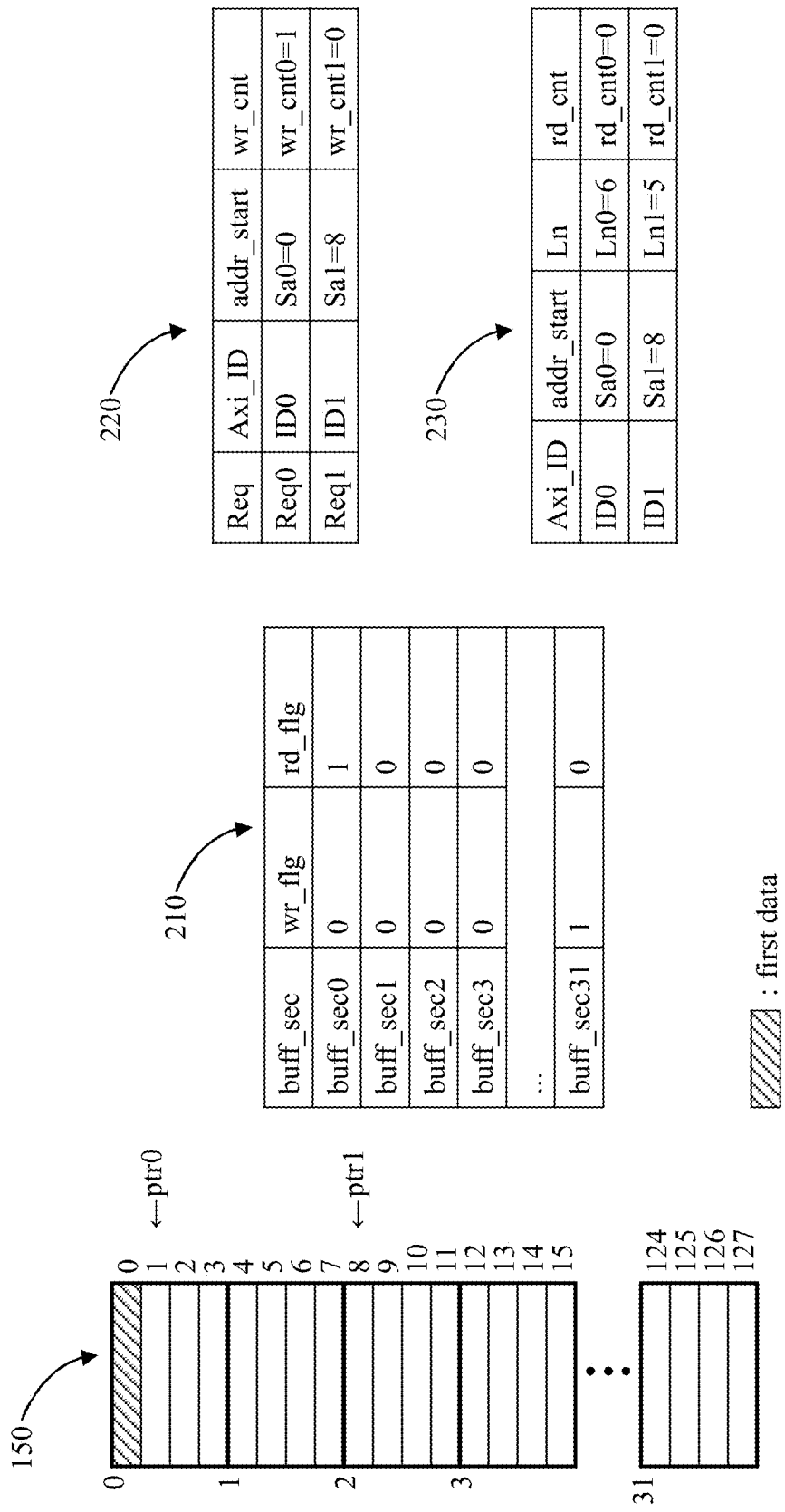
Figure 7:
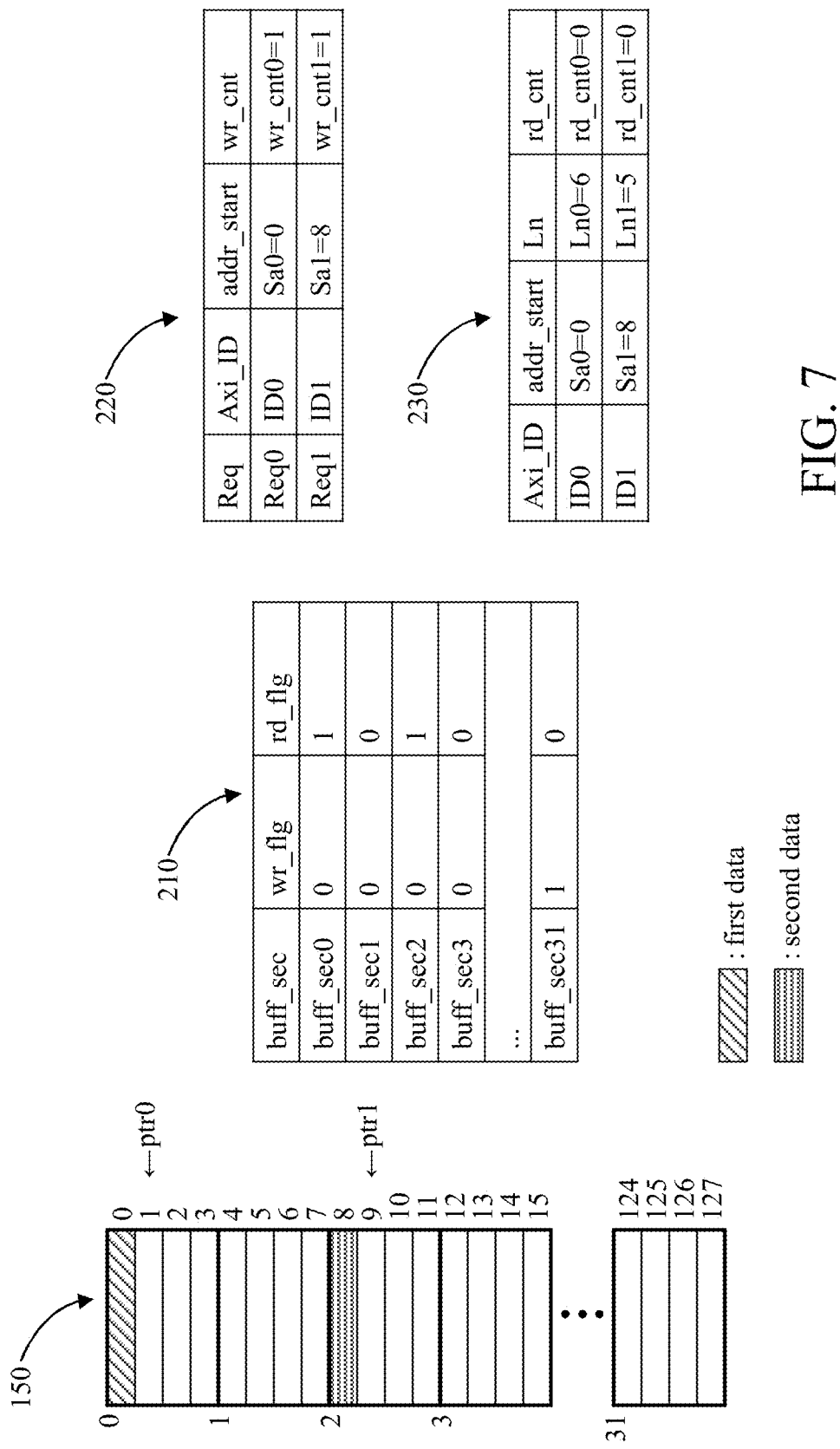
Figure 8:
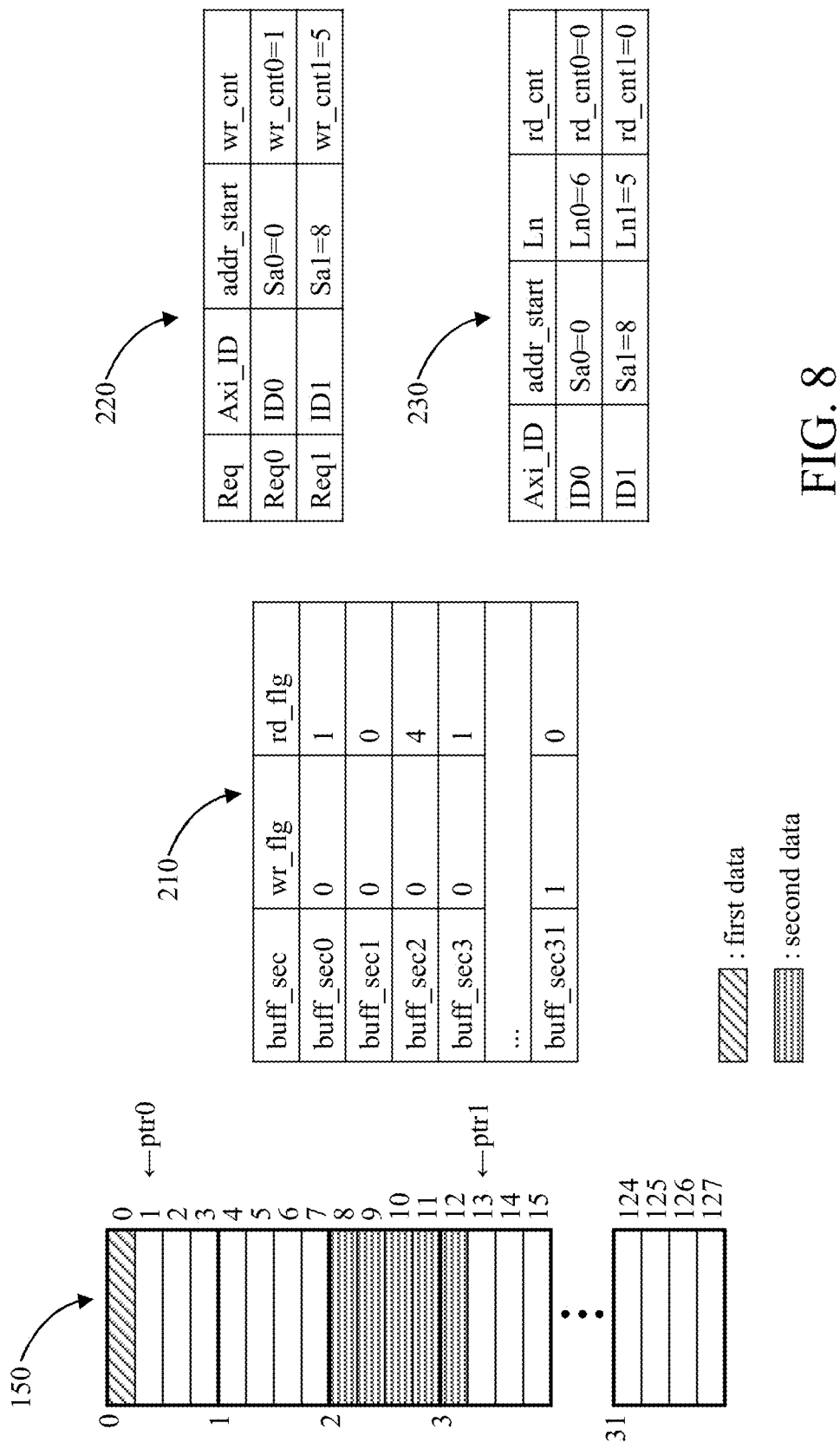

Reference is made to FIGS. 6-8 which show an example of the buffer circuit 150, the buffer section status table 210, the write status table 220, and the read status table 230 according to the flow of FIG. 5.

FIG. 6 (continuing FIG. 4) shows the write address generation circuit 120 writing the first set of data corresponding to the read request Req0 into the buffer block buff0 (which is equivalent to executing the flow of FIG. 5 once). Because one set of data has been written into the buffer section buff_sec0 at this point, the value of the read status flag rd_flg of the buffer section buff_sec0 is one (step S550), and the value of the write count wr_cnt0 is one (step S560).

FIG. 7 (continuing FIG. 6) shows the write address generation circuit 120 writing the first set of data corresponding to the read request Req1 into the buffer block buff8. Because one set of data has been written into the buffer block buff8 at this point, the value of the read status flag rd_flg of the buffer section buff_sec2 is one (step S550), and the value of the write count wr_cnt1 is one (step S560).

FIG. 8 (continuing FIG. 7) shows the write address generation circuit 120 writing the second to fifth sets of data corresponding to the read request Req1 into the buffer block buff9 to the buffer block buff12 (which is equivalent to consecutively executing the flow of FIG. 5 four times). Because four sets of data have been written into the buffer section buff_sec2 and one set of data has been written into the buffer block buff12 at this point, the value of the read status flag rd_flg of the buffer section buff_sec2 is four, the value of the read status flag rd_flg of the buffer section buff_sec3 is one, and the value of the write count wr_cnt1 is five.

FIGS. 6-8 show that the write address generation circuit 120 does not process all of the first data before processing the second data, which means that the DMA circuit 100 can randomly process the read request Req0 and the read request Req1.

Figure 9:
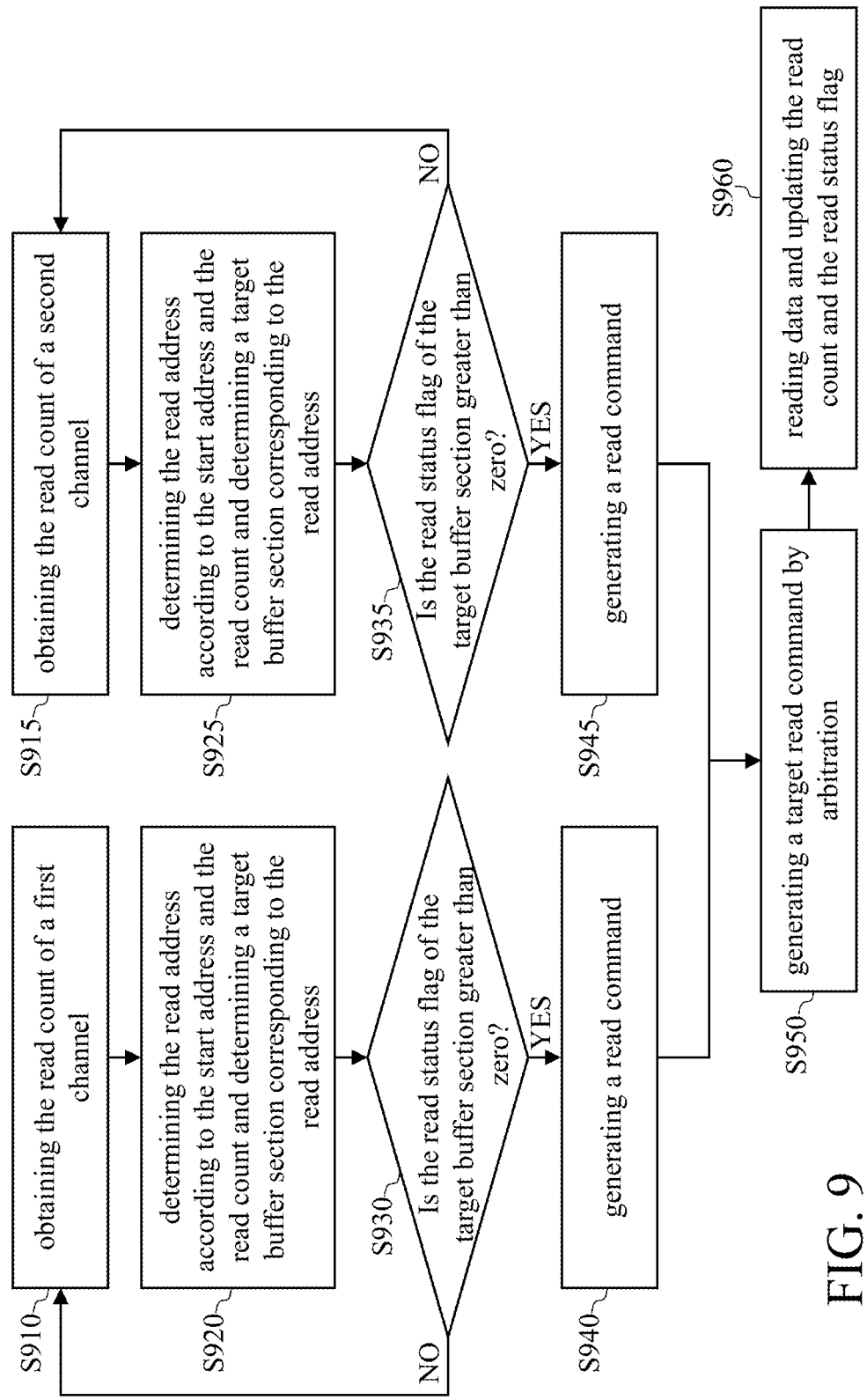
FIG. 9 is a flowchart of the control circuit reading data from the buffer circuit.

FIG. 9 is a flowchart of the control circuit 140 reading data from the buffer circuit 150. The flowchart includes the following steps.

Step S910: The read address generation circuit 130 obtains the read count rd_cnt0 of the channel 160 according to the start address Sa0 of the channel 160.

Figure 10:
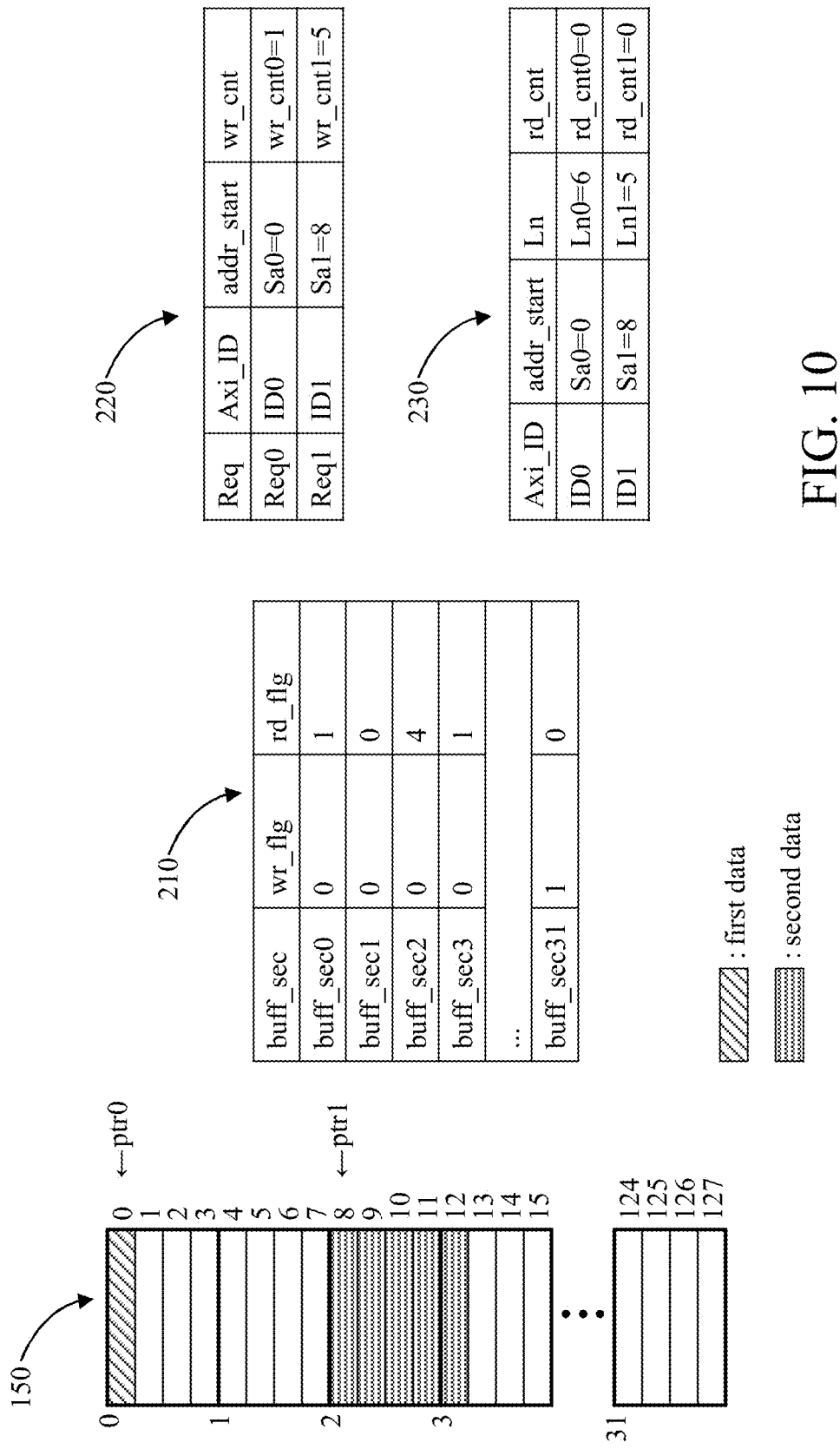

Step S920: The read address generation circuit 130 determines the read address according to the start address Sa0 and the read count rd_cnt0, and determines a target buffer section corresponding to the read address. Reference is made to FIG. 10 (continuing FIG. 8). At this point, the read address corresponding to the channel 160 is Sa0+rd_cnt0=0+0=0 (i.e., the address pointed to by the pointer ptr0), and the target buffer section corresponding to the pointer ptr0 is [0/4]−0 (zero is the read address, four is the aforementioned granularity X).

Step S930: The read address generation circuit 130 determines whether the read status flag rd_flg of the target buffer section is greater than zero. If YES (meaning that there is still unread data in the target buffer section), then the flow proceeds to step S940; if NO, steps S910 to S930 are repeated until there is unread data in the target buffer section. In the example of FIG. 10, because the read status flag rd_flg of the target buffer section (i.e., the buffer section buff_sec0) is one, the result of step S930 is YES.

Step S940: The read address generation circuit 130 generates a read command rd_cmd0 to read the data in the target buffer section buff_sec0.

Steps S915 to S945 correspond to the operations of the second channel, and the details are similar or identical to steps S910 to S940 respectively. Taking the example of FIG. 10 as an example, the read address of the channel 170 is Sa1+rd_cnt1=8+0=8 (i.e., the address pointed to by the pointer ptr1), and the target buffer section is [8/4]=2. Because the read status flag rd_flg of the target buffer section (i.e., the buffer section buff_sec2) is four, the result of step S935 is YES, and the read address generation circuit 130 generates the read command rd_cmd1 to read the data in the target buffer section buff_sec2 (Step S945).

Step S950: The control circuit 140 arbitrates between the read command rd_cmd0 and the read command rd_cmd1 according to a predetermined arbitration rule (e.g., round-robin) to generate a target read command rd_cmd. Continuing the above example, if the target read command rd_cmd is the read command rd_cmd0 (rd_cmd1), then the target read address rd_addr is the address pointed to by the pointer ptr0 (ptr1).

Figure 11:
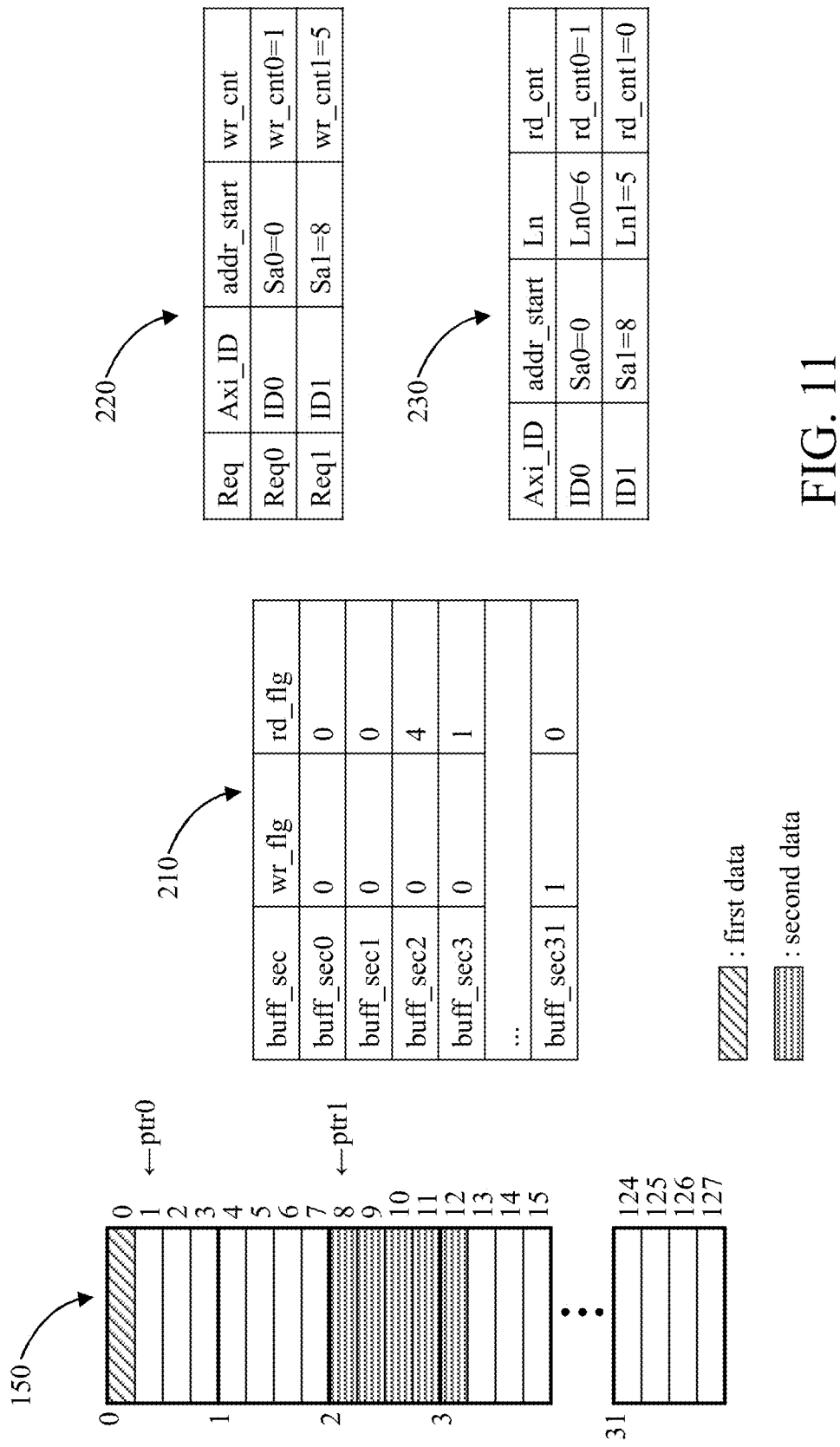

Step S960: The control circuit 140 issues the target read command rd_cmd to read data from the buffer circuit 150, and controls the read address generation circuit 130 to update the corresponding read count rd_cnt and the read status flag rd_flg (which is equivalent to the read address generation circuit 130 updating the corresponding read count rd_cnt and updating the read status flag rd_flg according to the target read address rd_addr). Reference is made to FIG. 11 (continuing FIG. 10) where it is assumed that the target read command rd_cmd is the read command rd_cmd0, the control circuit 140 reads the data of the buffer block buff0, and the read address generation circuit 130 increases the read count rd_cnt0 by one (i.e., rd_cnt0 changes from zero to one) and decreases the read status flag rd_flg of the target buffer section buff_sec0 by one (i.e., rd_flg changes from one to zero).

As shown in FIG. 11, since the first data currently includes only the data in the buffer block buff0 and has been read (i.e., the read status flag rd_flg of the buffer section buff_sec0 is zero), the result of step S930 maintains NO until the DMA circuit 100 receives more first data from the target device. At this point, since the channel 160 does not generate a read command for now, the control circuit 140 continues to use the read command rd_cmd1 generated by the channel 170 as the target read command rd_cmd (step S950) until the channel 160 generates the read command rd_cmd0 again or all of the second data has been read.

Figure 12:
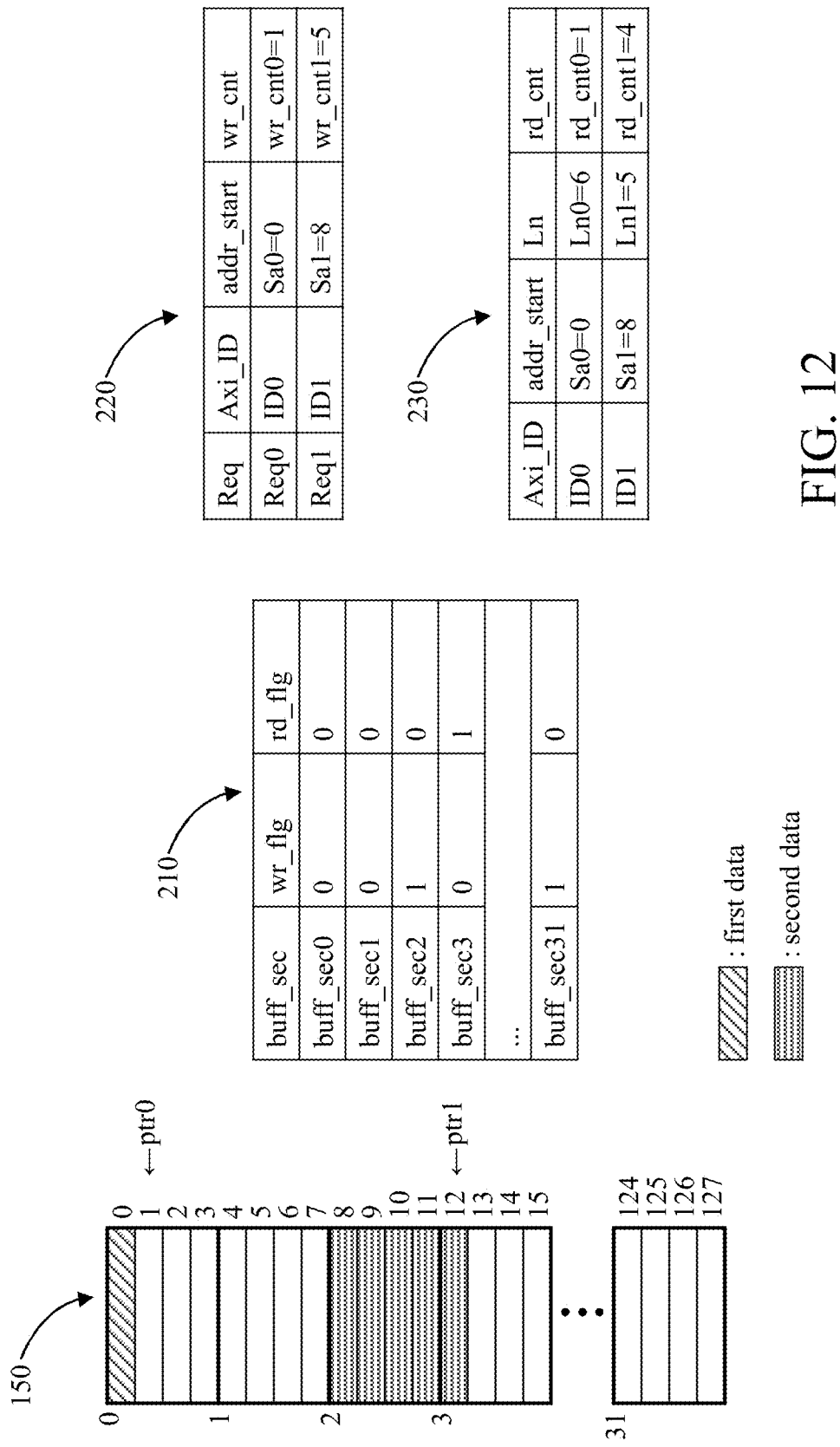
Figure 13:
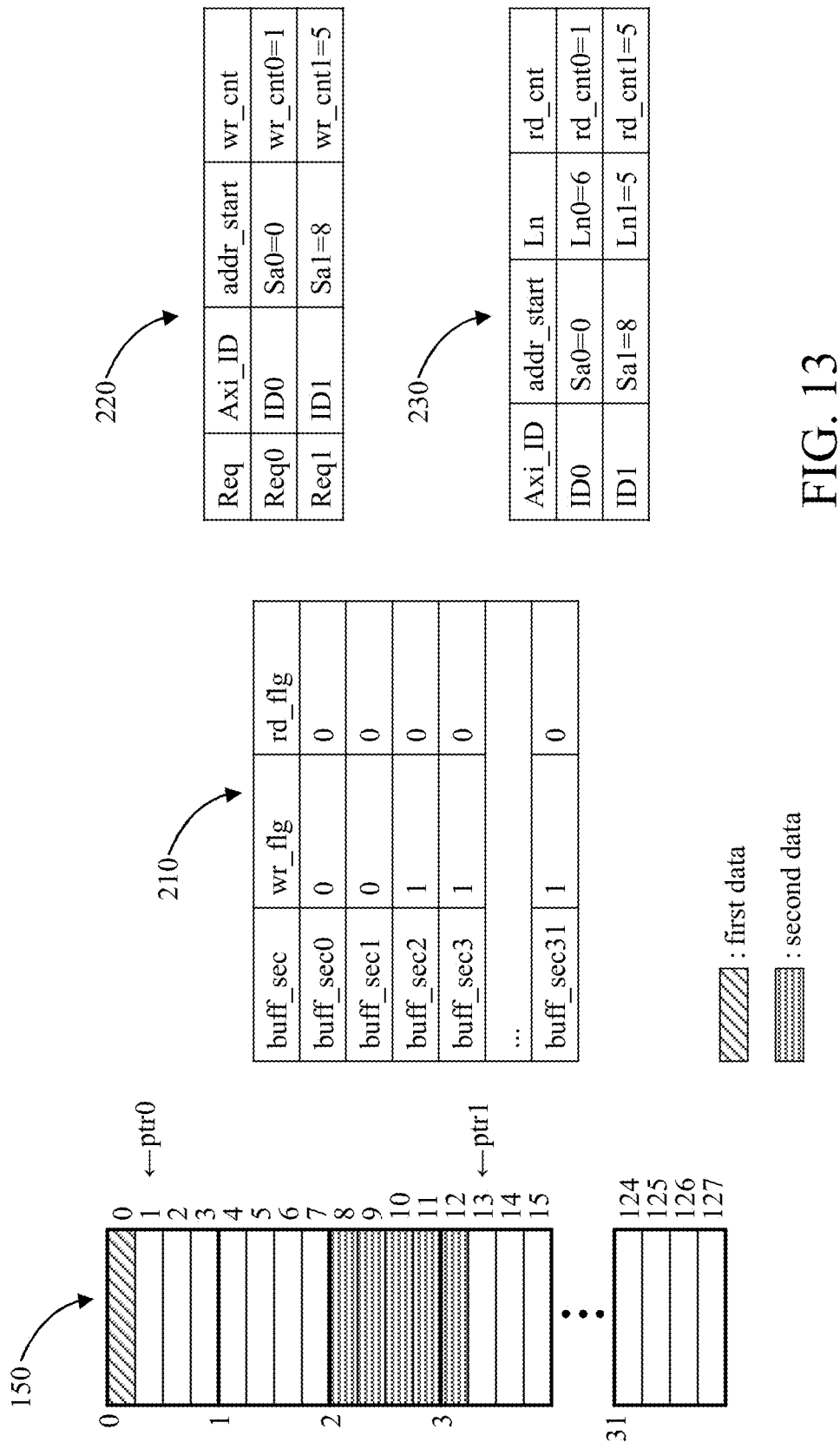

FIGS. 12-13 show that the control circuit 140 consecutively reads the second data. FIG. 12 (continuing FIG. 11) shows that the four sets of data in the buffer section buff_sec2 have been read; therefore, the read status flag rd_flg of the buffer section buff_sec2 changes from four to zero, and the read count rd_cnt1 changes from zero to four. FIG. 13 (continuing FIG. 12) shows that the control circuit 140 further reads one set of data from the buffer section buff_sec3; therefore, the read status flag rd_flg of the buffer section buff_sec3 changes from one to zero, and the read count rd_cnt1 changes from four to five. At this point, because the read count rd_cnt1 and the data length Ln1 are both equal to five, the control circuit 140 knows that all of the second data has been read.

Note that after the control circuit 140 reads the last set of data of a buffer section buff_sec, the control circuit 140 updates the write status flag wr_flg corresponding to that buffer section buff_sec (i.e., resets the write status flag wr_flg to one). More specifically, because the buffer section buff_sec2 has four sets of data to be read, the control circuit 140 does not reset the write status flag wr_flg corresponding to the buffer section buff_sec2 to one until the control circuit 140 has finished reading the data in the buffer block buff11 (FIG. 12). Next, because the buffer section buff_sec3 has only one set of data to be read, after finishing reading the data in the buffer block buff12, the control circuit 140 resets the write status flag wr_flg corresponding to the buffer section buff_sec3 to one (FIG. 13).

Figure 14:
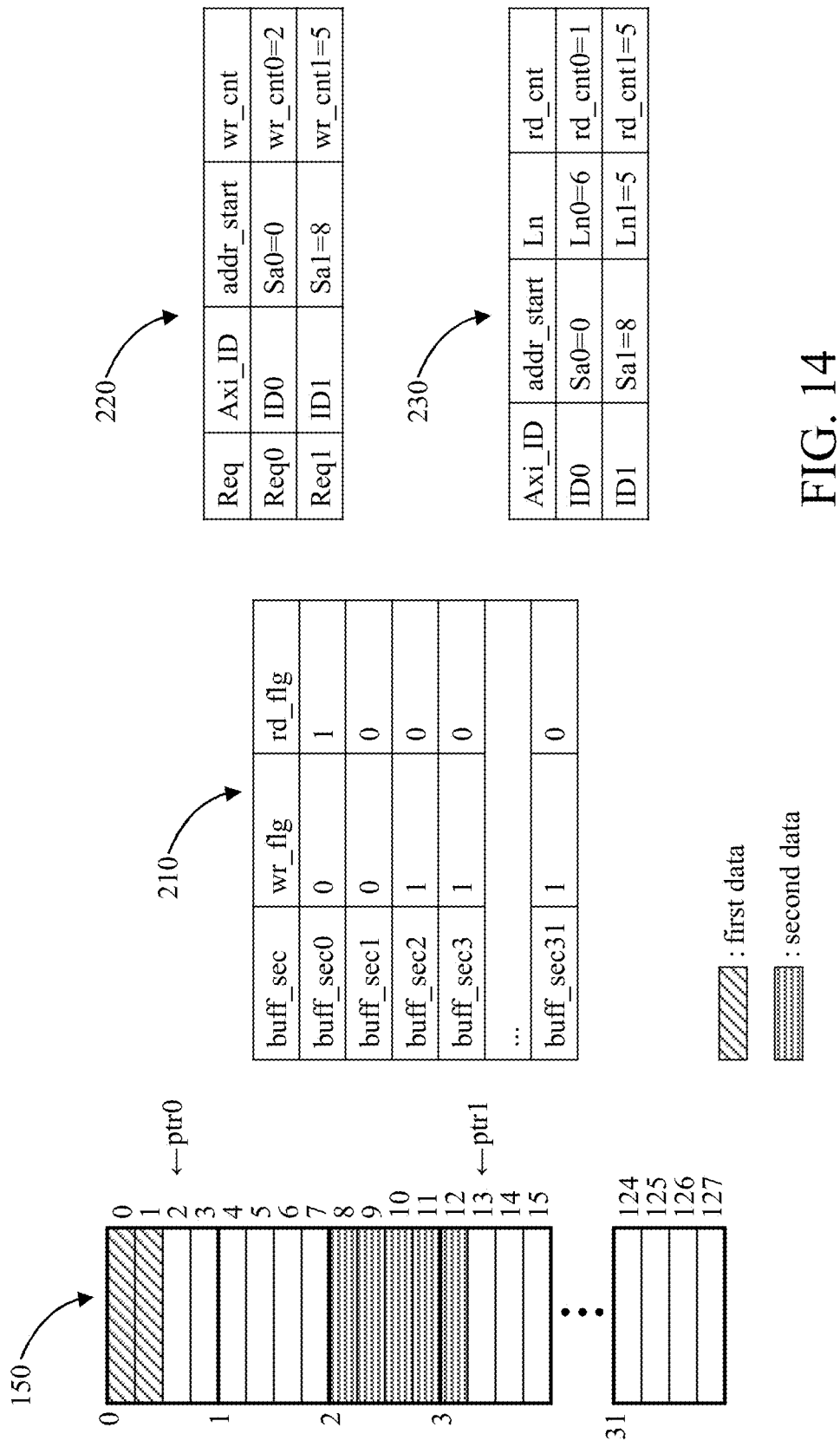
Figure 15:
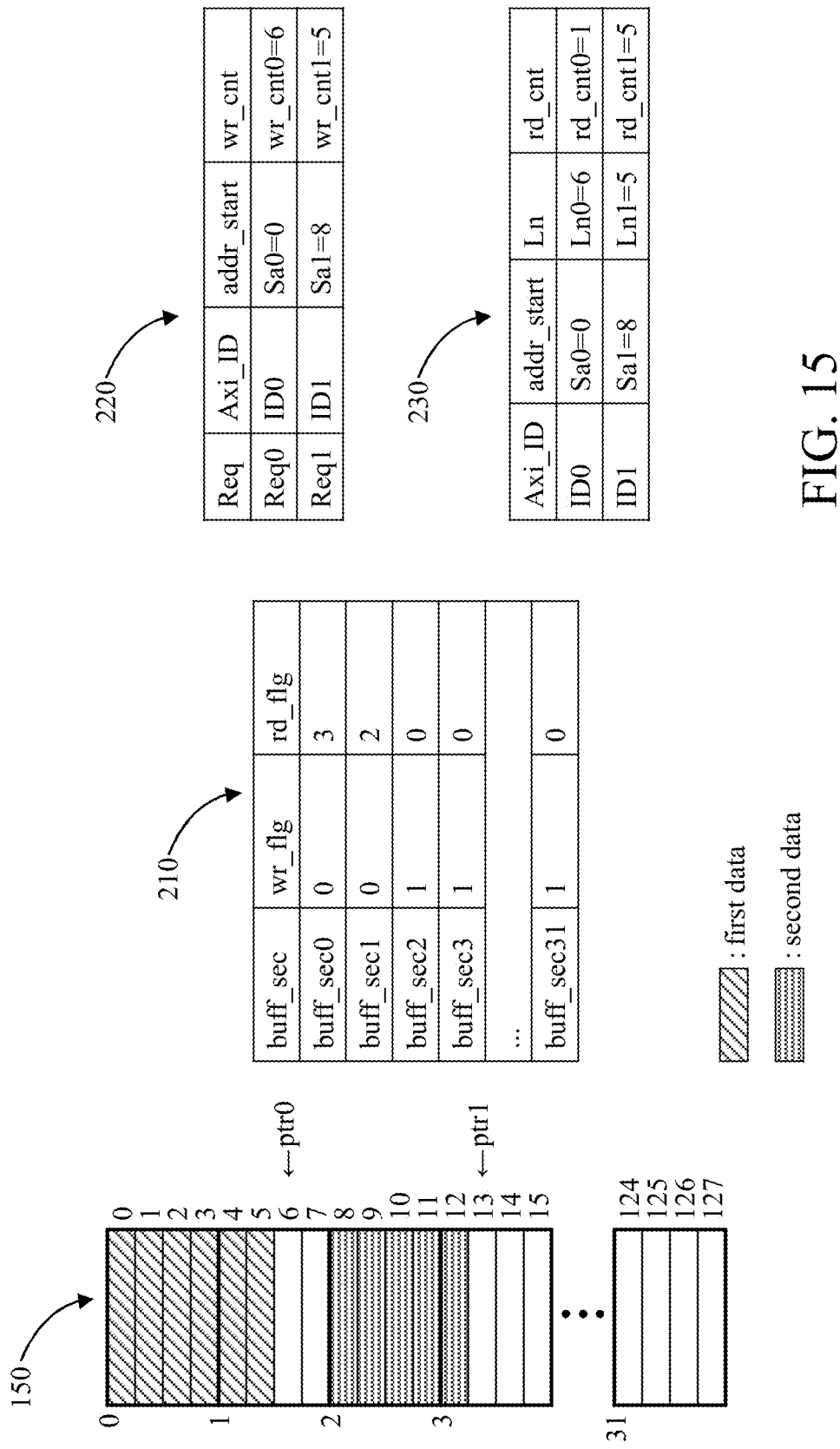

After all of the second data is read (FIG. 13), the write address generation circuit 120 receives the first data corresponding to the read request Req0 and writes it into the buffer circuit 150. The process is shown in FIGS. 14-15 (refer to the flow in FIG. 5). FIG. 14 (continuing FIG. 13) shows that the write address generation circuit 120 writes the second set of data of the first data in the buffer block buff1; as a result, the read status flag rd_flg of the buffer section buff_sec0 changes from zero to one, and the write count wr_cnt0 changes from one to two. FIG. 15 (continuing FIG. 14) shows that the write address generation circuit 120 continues to write two sets of data in the buffer section buff_sec0, and then writes another two sets of data in the buffer section buff_sec1; as a result, the read status flag rd_flg of the buffer section buff_sec changes from one to three, the read status flag rd_flg of the buffer section buff_sec1 changes from zero to two, and the write count wr_cnt0 changes from two to six.

Figure 16:
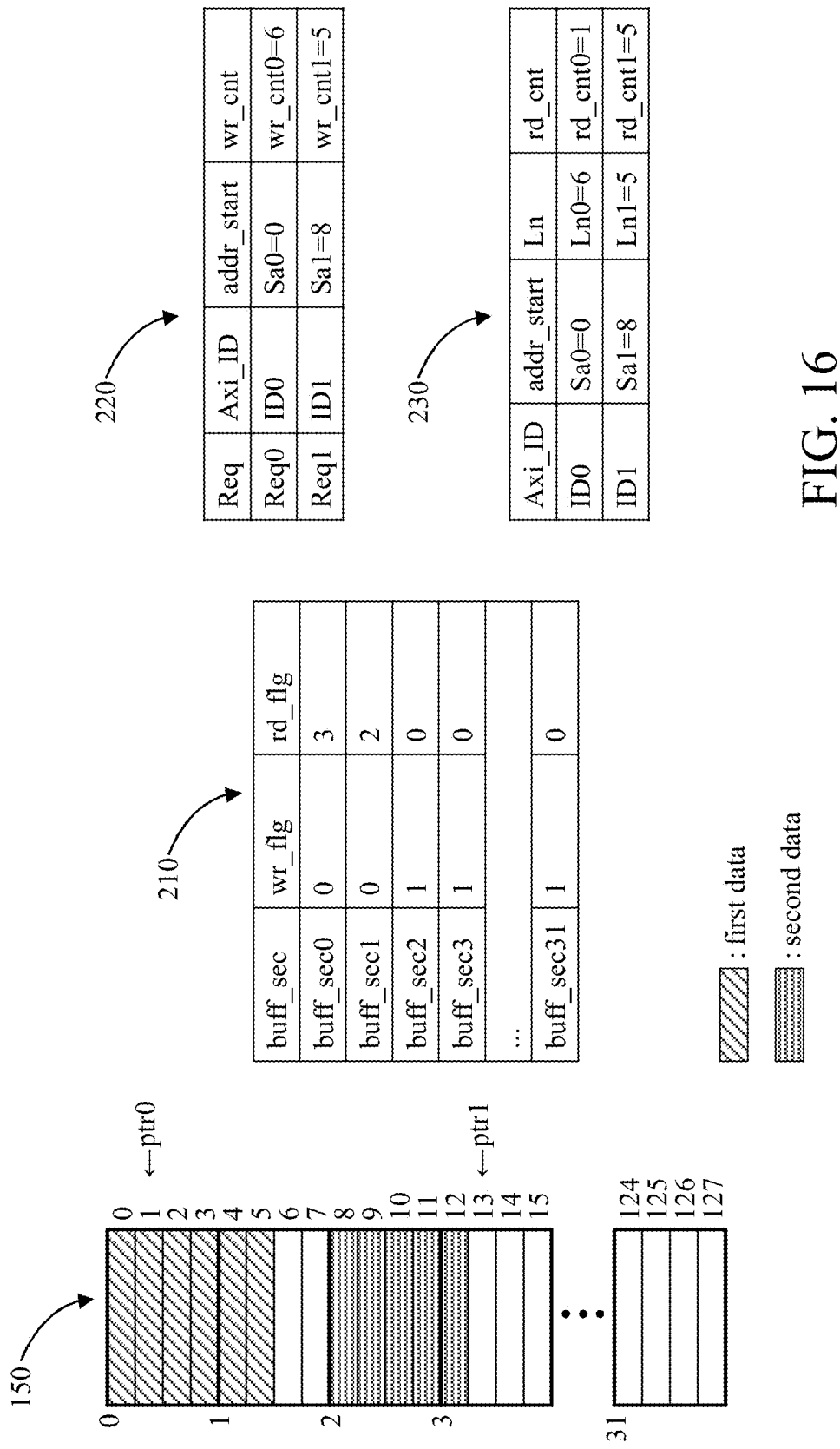
Figure 17:
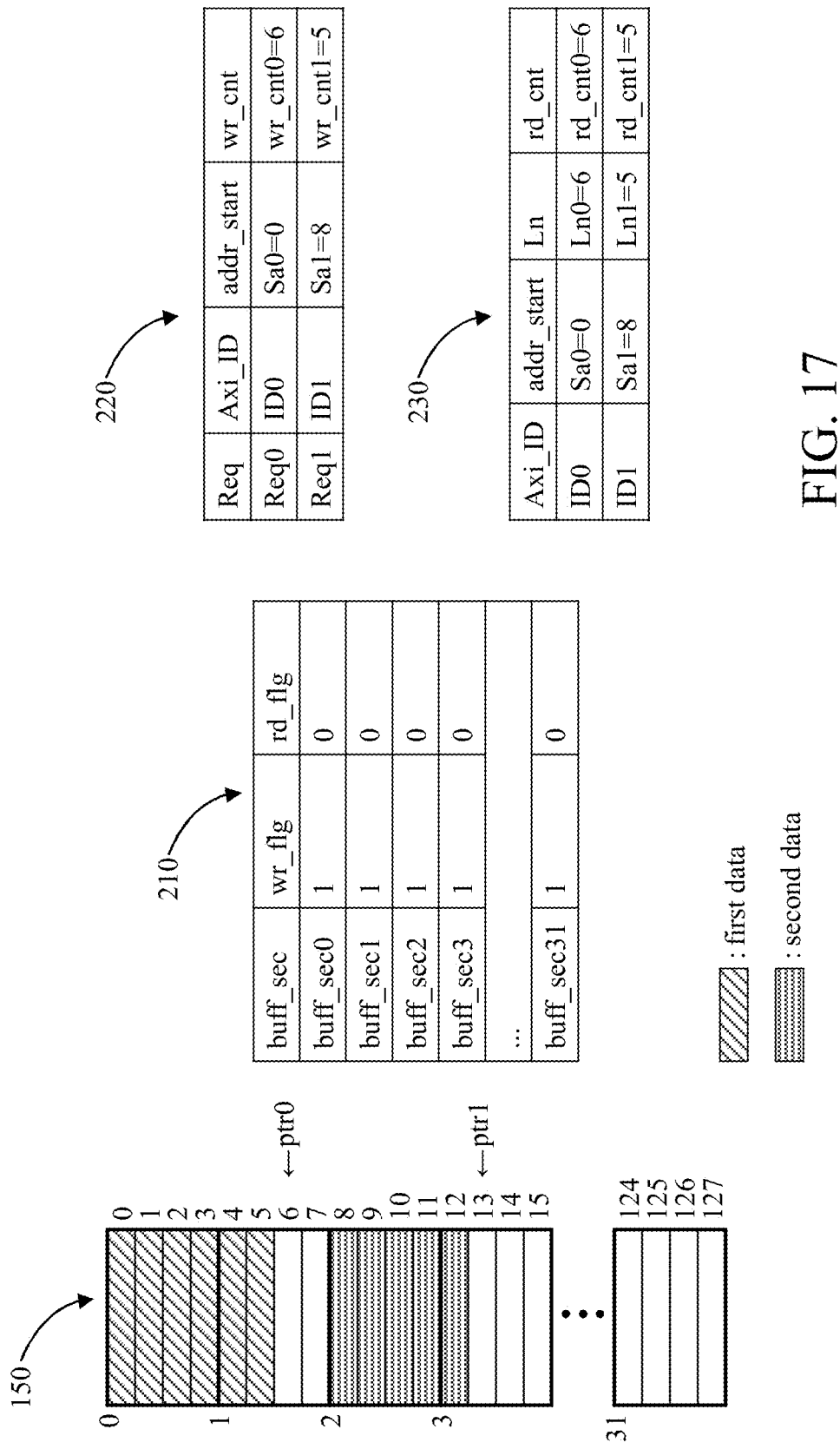

As shown in FIG. 15, because the read status flag rd_flg of the buffer section buff_sec0 is greater than zero (i.e., the result of step S930 in FIG. 9 is YES), the control circuit 140 will read the first data in the subsequent process. As shown in FIG. 16 (continuing FIG. 15), because the read count rd_cnt0 is one, the control circuit 140 reads data sequentially starting from the buffer block buff1 (i.e., Sa0+rd_cnt0=0+1=1) (i.e., repeats the flow of FIG. 9). FIG. 17 (continuing FIG. 16) shows the state after all of the first data is read. At this point, the write status flags wr_flg of the buffer section buff_sec0 and the buffer section buff_sec1 change to one, and the read status flags rd_flg of the buffer section buff_sec0 and the buffer section buff_sec1 change to zero, and the read count rd_cnt0 changes to six.

In summary, the present invention can improve the performance of the DMA circuit. More specifically, even if a certain channel encounters data latency (e.g., in FIGS. 6-8, latency occurs to the first data), the writing and reading of data on the other channel are not affected (as shown in FIGS.

11-13, when there is latency in the first data, the second data can still be written and read smoothly). In addition, the writing of the first data can be interrupted (as shown in the above implementation, the first part of the first data (e.g., the buffer block buff0) and the second part of the first data (e.g., the buffer blocks buff1 to buff5) are not written consecutively), and the reading of the first data can also be interrupted (as shown in the above implementation, the first data is not read consecutively).

Figure 18:
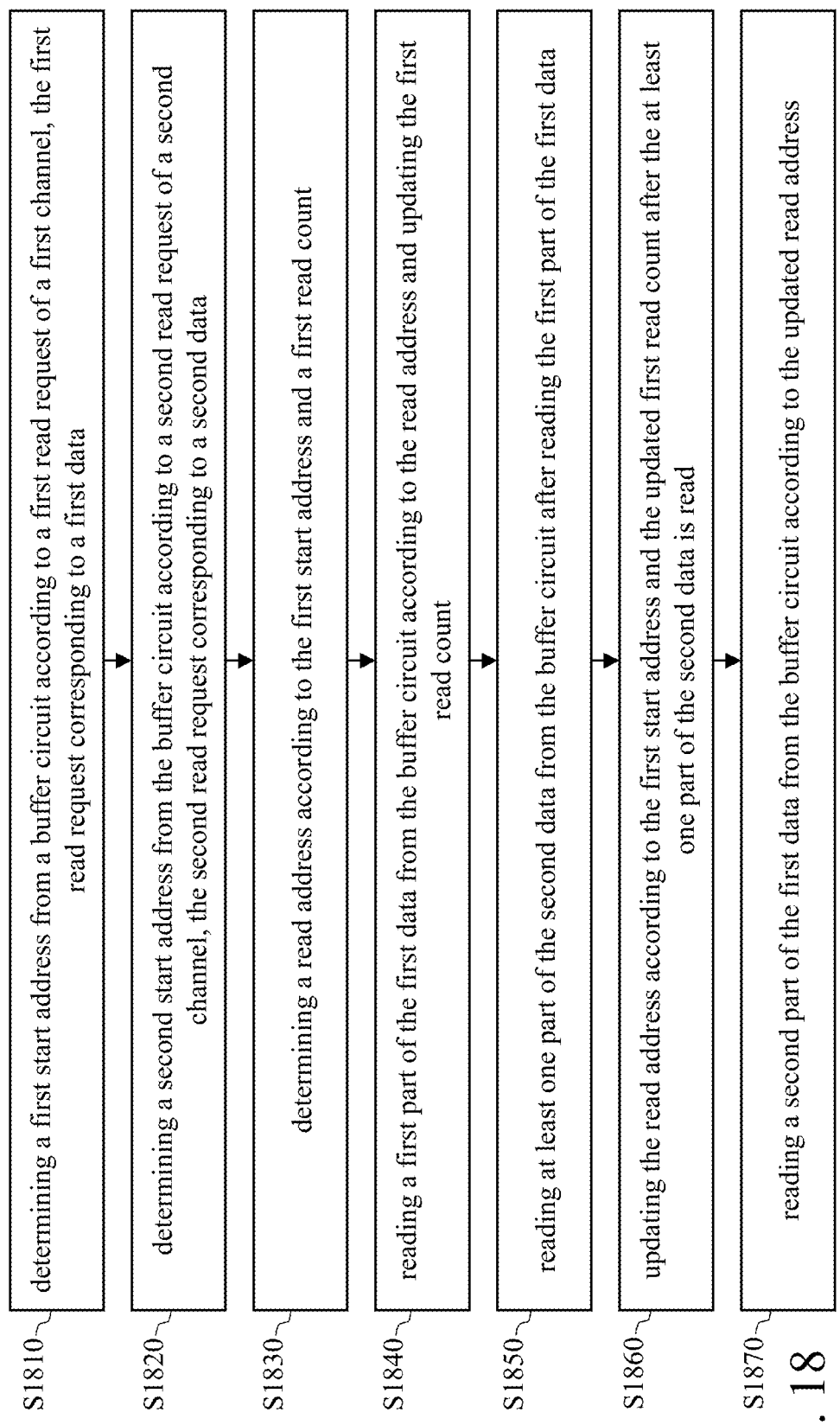
FIGS. 18-19 are flowcharts of the operation method of the DMA circuit according to an embodiment of the present invention.

FIG. 18 shows a flowchart of the operation method of the DMA circuit according to an embodiment of the present invention. The flowchart includes the following steps.

Step S1810: The write status determination circuit 110 determines a first start address (e.g., the start address Sa0) from the buffer circuit 150 according to a first read request (e.g., the read request Req0) of a first channel (e.g., the channel 160), the first read request corresponding to a first data.

Step S1820: The write status determination circuit 110 determines a second start address (e.g., the start address Sa1) from the buffer circuit 150 according to a second read request (e.g., the read request Req1) of a second channel (e.g., the channel 170), the second read request corresponding to a second data. For details of step S1810 and step S1820, refer to the discussion of FIGS. 2-4.

Step S1830: The read address generation circuit 130 determines a read address according to the first start address and a first read count (e.g., the read count rd_cnt0). Refer to FIG. 9 for details of step S1830.

Step S1840: The control circuit 140 reads a first part of the first data from the buffer circuit 150 according to the read address, and updates the first read count. Step S1840 may correspond to FIGS. 10-11.

Step S1850: After the first part of the first data is read, the control circuit 140 reads at least one part of the second data from the buffer circuit 150. Step S1840 may correspond to FIGS. 11-12 or FIGS. 11-13.

Step S1860: After the at least one part of the second data is read, the read address generation circuit 130 updates the read address according to the first start address and the updated first read count. Refer to FIG. 9 for details of step S1860.

Step S1870: The control circuit 140 reads a second part of the first data from the buffer circuit according to the updated read address. Step S1870 may correspond to FIGS. 16-17.

Figure 19:
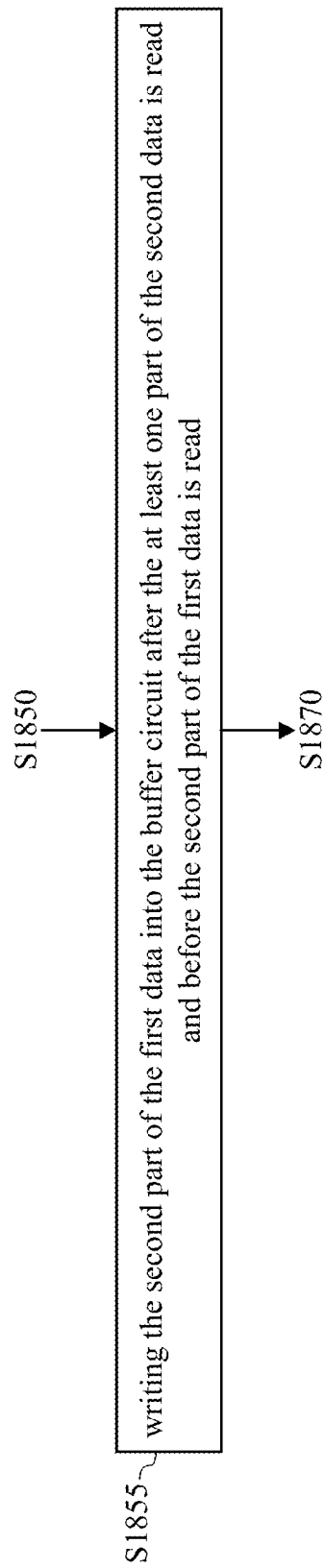

The operation method of the DMA circuit of the present invention may also include step S1855 of FIG. 19: the write address generation circuit 120 writes the second part of the first data into the buffer circuit after the at least one part of the second data is read (i.e., step S1850) and before the second part of the first data is read (i.e., step S1870). Step S1855 may correspond to FIGS. 14-15.

Figure 20:
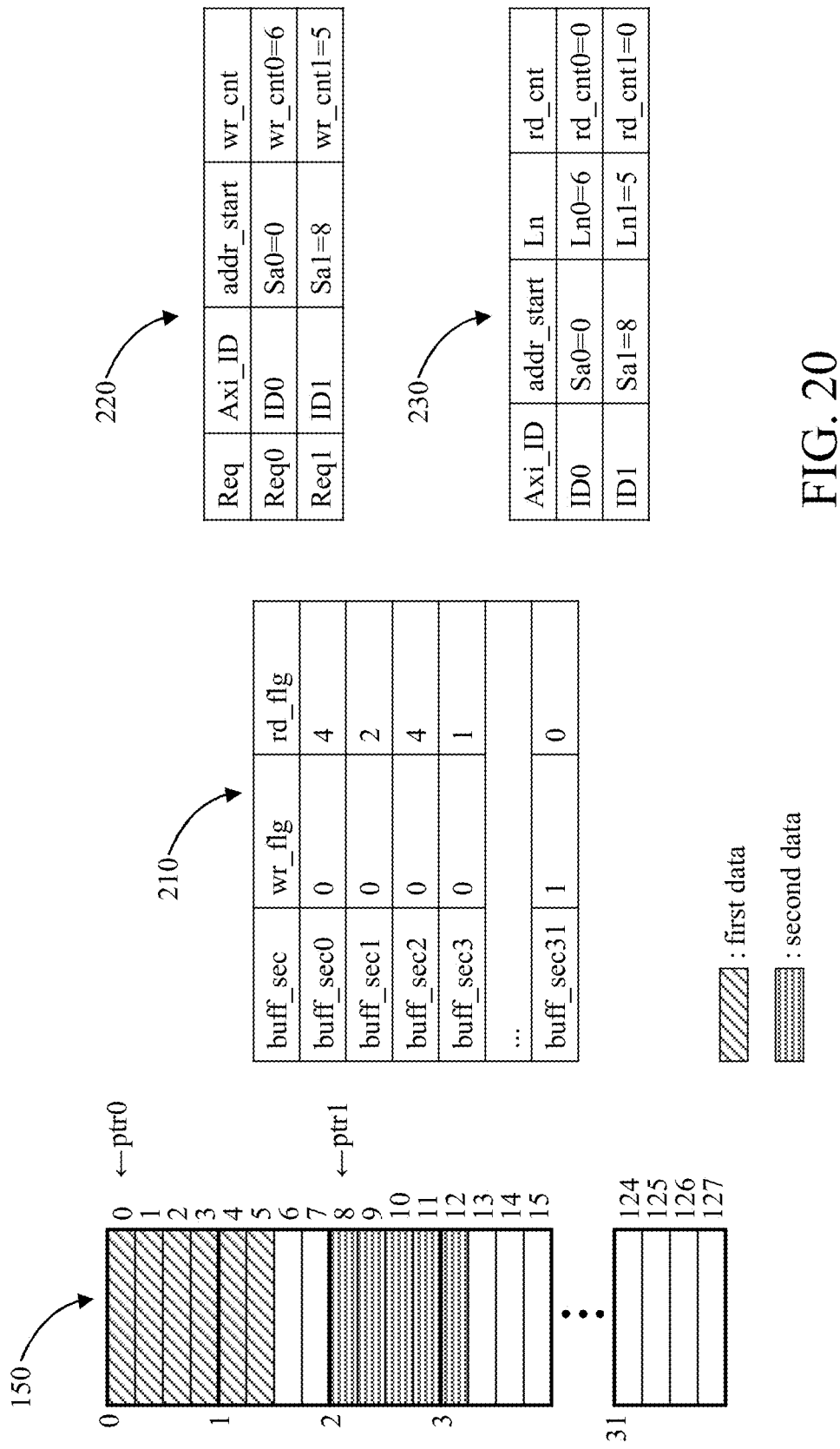

Note that step S1855 may not be performed (i.e., the writing of the first data may not be interrupted). More specifically, in some embodiments, even if the first data is not read until all of which has been written into the buffer circuit 150, the reading of the first data by the control circuit 140 may be interrupted due to step S950 in FIG. 9 (i.e., corresponding to steps S1840 to S1870 in FIG. 18). For example, assuming that both the first data and the second data have been written into the buffer circuit 150 but have not been read yet (as shown in FIG. 20), the target read commands rd_cmd generated by arbitration in step S950 may be in the following sequence: the read command rd_cmd0 (to read the buffer section buff_sec0)→the read command rd_cmd1 (to read the buffer section buff_sec2)→the read command rd_cmd0 (to read the buffer section buff_sec1)→the read command rd_cmd1 (to read the buffer section buff_sec3); in other words, the first data is not read consecutively.

People having ordinary skill in the art can implement the write status determination circuit 110, the write address generation circuit 120, the read address generation circuit 130, and the control circuit 140 with logic circuits based on the above discussion.

The number of channels is intended to illustrate the invention by way of example and not to limit the scope of the claimed invention. People having ordinary skill in the art may apply the present invention to more than two channels in accordance with the foregoing discussions.

In addition, based on the above discussion, people having ordinary skill in the art may also implement the present invention in a scenario where at least one of the read operation and the write operation of a single channel is random. That is to say, the write operation (or read operation) of the channel 160 and the write operation (or read operation) of the channel 170 are considered to be write operations (or read operations) of different data parts of the same channel.

The aforementioned descriptions represent merely the preferred embodiments of the present invention, without any intention to limit the scope of the present invention thereto. Various equivalent changes, alterations, or modifications based on the claims of the present invention are all consequently viewed as being embraced by the scope of the present invention.

What is claimed is:

1. A method of operating a direct memory access (DMA) circuit, the DMA circuit comprising a buffer circuit, a first channel, and a second channel, the method comprising:
   determining a first start address from the buffer circuit according to a first read request of the first channel, the first read request corresponding to a first data;
   determining a second start address from the buffer circuit according to a second read request of the second channel, the second read request corresponding to a second data;
   determining a read address according to the first start address and a first read count;
   reading a first part of the first data from the buffer circuit according to the read address, and updating the first read count;
   reading at least one part of the second data from the buffer circuit according to the second start address after reading the first part of the first data;
   updating the read address according to the first start address and the updated first read count; and
   reading a second part of the first data from the buffer circuit according to the updated read address.

2. The method of claim 1 further comprising:
   writing the second part of the first data into the buffer circuit after reading the at least one part of the second data and before reading the second part of the first data.

3. The method of claim 1, wherein the buffer circuit comprises a plurality of buffer sections, each buffer section corresponds to a write status flag, and the write status flag is used to indicate whether the buffer section corresponding to the write status flag is unused, the method further comprising:
   determining a first buffer section from the buffer sections according to an amount of data of the first data and the write status flags;

wherein the first start address is a start address of the first buffer section, and the first buffer section is used to store the first data.

4. The method of claim 3 further comprising:
updating the write status flag corresponding to the first buffer section after determining the first buffer section.

5. The method of claim 1, wherein the buffer circuit comprises a first buffer section used to store the first part of the first data, the first buffer section has a read status flag, and the read status flag is used to indicate whether there is any unread data in the first buffer section, the method further comprising:
determining, according to the read status flag, whether to read the first part of the first data from the first buffer section before reading the first part of the first data.

6. The method of claim 5 further comprising:
writing the first part of the first data into the first buffer section; and
updating the read status flag when the first data is written into the first buffer section.

7. The method of claim 5 further comprising:
updating the read status flag after reading the first part of the first data.

8. The method of claim 1 further comprising:
updating the first read count after reading the first part of the first data.

9. The method of claim 1 further comprising:
writing the first part of the first data into the buffer circuit according to the first start address and a write count; and
updating the write count after the first part of the first data is written.

10. The method of claim 1, wherein the DMA circuit further comprises a second read count, the second read count corresponds to the second start address, and the second read count is different from the first read count.

11. A direct memory access (DMA) circuit, comprising:
a buffer circuit;
a first channel configured to generate a first read request;
a second channel configured to generate a second read request;
a write status determination circuit configured to determine a first start address from the buffer circuit according to the first read request, and determine a second start address from the buffer circuit according to the second read request, wherein the first read request corresponds to a first data, and the second read request corresponds to a second data;
a read address generation circuit configured to determine a read address according to the first start address and a first read count; and
a control circuit configured to read a first part of the first data from the buffer circuit according to the read address, control the read address generation circuit to update the first read count, and read at least one part of the second data from the buffer circuit according to the second start address after the first part of the first data is read;
wherein the read address generation circuit further updates the read address according to the first start address and the updated first read count, and the control circuit further reads a second part of the first data from the buffer circuit according to the updated read address.

12. The DMA circuit of claim 11 further comprising:
a write address generation circuit configured to write the second part of the first data into the buffer circuit after the at least one part of the second data is read and before the second part of the first data is read.

13. The DMA circuit of claim 11, wherein the buffer circuit comprises a plurality of buffer sections, each buffer section corresponds to a write status flag, the write status flag is used to indicate whether the buffer section corresponding to the write status flag is unused, the write status determination circuit further determines, according to an amount of data of the first data and the write status flags, a first buffer section from the buffer sections to store the first data, and the first start address is a start address of the first buffer section.

14. The DMA circuit of claim 13, wherein the write status determination circuit further updates the write status flag corresponding to the first buffer section after the first buffer section is determined.

15. The DMA circuit of claim 11, wherein the buffer circuit comprises a first buffer section for storing the first part of the first data, the first buffer section has a read status flag, the read status flag is used to indicate whether there is any unread data in the first buffer section, the read address generation circuit further determines whether to read the first part of the first data from the first buffer section according to the read status flag before the control circuit reads the first part of the first data.

16. The DMA circuit of claim 15, wherein the DMA circuit further comprises a write address generation circuit, the write address generation circuit is configured to write the first part of the first data to the first buffer section, and the read address generation circuit updates the read status flag when the first part of the first data is written into the first buffer section.

17. The DMA circuit of claim 15, wherein the read address generation circuit further updates the read status flag after the first part of the first data is read.

18. The DMA circuit of claim 11, wherein the read address generation circuit further updates the first read count after the first part of the first data is read.

19. The DMA circuit of claim 11 further comprising:
a write address generation circuit configured to write the first part of the first data into the buffer circuit according to the first start address and a write count, and update the write count.

20. The DMA circuit of claim 11, wherein the read address generation circuit further stores a second read count, the second read count corresponds to the second start address, and the second read count is different from the first read count.

* * * * *